(12) United States Patent
Thomas et al.

(10) Patent No.: US 10,752,385 B2
(45) Date of Patent: Aug. 25, 2020

(54) MAGNETIC DIPOLE CANCELLATION (71) Applicant: Princeton Satellite Systems, Inc., Plainsboro, NJ (US)

(72) Inventors: Stephanie Thomas, West Windsor, NJ (US); Michael A. Paluszek, Princeton, NJ (US)

(73) Assignee: PRINCETON SATELLITE SYSTEMS, INC., Plainsboro, NJ (US)

( * ) Notice: Subject to any disclaimer, the term of this patent is extended or adjusted under 35 U.S.C. 154(b) by 312 days.

(21) Appl. No.: 15/917,204

(22) Filed: Mar. 9, 2018

(65) Prior Publication Data
US 2018/0257794 A1 Sep. 13, 2018

Related U.S. Application Data (60) Provisional application No. 62/469,318, filed on Mar. 9, 2017.

(51) Int. Cl.
*B64G 1/36* (2006.01)
*G01L 3/00* (2006.01)
*G01R 33/02* (2006.01)
*G01R 33/07* (2006.01)
*H01F 5/00* (2006.01)
*B64G 1/32* (2006.01)
(Continued)

(52) U.S. Cl.
CPC .............. *B64G 1/366* (2013.01); *B64G 1/32* (2013.01); *G01L 3/00* (2013.01); *G01R 33/0206* (2013.01); *G01R 33/072* (2013.01); *H01F 5/00* (2013.01); *B64G 1/361* (2013.01); *B64G 1/363* (2013.01); *B64G 2001/245* (2013.01); *B64G 2700/24* (2013.01); *H01F 6/06* (2013.01); *H03H 17/0257* (2013.01)

(58) Field of Classification Search
CPC ...................................... B64G 1/366
See application file for complete search history.

(56) References Cited

U.S. PATENT DOCUMENTS

| 5,047,945 A * | 9/1991 | Paluszek | B64G 1/283 |
| | | | 701/13 |
| 5,248,118 A * | 9/1993 | Cohen | B64G 1/24 |
| | | | 244/164 |

(Continued)

*Primary Examiner* — Richard R. Green
*Assistant Examiner* — Arfan Y Sinaki
(74) *Attorney, Agent, or Firm* — Volpe and Koenig, P.C.

(57) ABSTRACT

A dipole cancellation system and method may include a plurality of magnetometers for measuring a device magnetic field associated with a plurality of device coils generating a device magnetic field having a primary magnetic dipole moment. A compensating coil carrying a compensating current running a first direction that generates a compensating magnetic field having a compensating magnetic dipole moment. The compensating coil may be positioned and the first current may be selected so that the compensating magnetic dipole moment completely cancels the primary magnetic dipole moment. A method may use the system to stabilize a spacecraft by calculating an estimated torque of the spacecraft, receiving a value for an external magnetic field, receiving a value for a device magnetic field, and calculating and applying a compensating current may be then applied to the compensating coil to cancel the primary magnetic dipole moment, wherein the spacecraft is stabilized.

14 Claims, 7 Drawing Sheets (51) Int. Cl.
*H03H 17/02* (2006.01)
*H01F 6/06* (2006.01)
*B64G 1/24* (2006.01)

(56) References Cited

U.S. PATENT DOCUMENTS 6,371,413 B1 * 4/2002 Duchon .................. B64G 1/24
　　　　　　　　　　　　　　　　　　　244/164
9,822,769 B2 * 11/2017 Cohen .................... B64G 1/408

* cited by examiner

MAGNETIC DIPOLE CANCELLATION

CROSS REFERENCE TO RELATED APPLICATIONS

This application is an international application filed under the Patent Cooperation Treaty and claims priority to U.S. Provisional Application Ser. No. 62/469,318 filed Mar. 9, 2017, which is incorporated by reference as if fully disclosed herein.

STATEMENT REGARDING FEDERALLY SPONSORED RESEARCH OR DEVELOPMENT

This invention was made with Government support under Contract No. NNX16AK28G awarded by NASA. The Government has certain rights in the invention.

FIELD OF THE INVENTION

The present invention relates to control of spacecraft with large magnetic dipole moments that themselves cannot be cancelled or perturbed.

BACKGROUND

The magnetic dipole moment on a spacecraft will produce a torque on the spacecraft due to the interaction of the dipole with the Earth's or another planet (such as Jupiter's) magnetic field. The magnetic dipole moment of a spacecraft may be due to current loops on the spacecraft or to permanent magnets on the spacecraft. The torque is computed from this equation:

$$T = M \times B \quad \text{(Equation 1)}$$

This equation dictates that torque (T) is the cross product between the magnetic dipole (M) and the Earth's or planet's magnetic field (B). This torque will cause the spacecraft to rotate. If such rotation is not desired, the torque will require compensation with another inertial torque in the opposite direction. An inertial torque is any torque that changes the spacecraft's angular momentum. The reference frame of the torque in the equation is the same as that of the dipole moment and the magnetic field. This torque produces an inertial torque on the spacecraft that will cause it to gain angular momentum over time. This angular momentum must be removed. For example, thrusters could be used to produce torques to compensate for this undesired torque. Solar pressure from the solar wings on a spacecraft with rotating wings could also be used to compensate for the torque due to a residual dipole, for example.

Generally, a magnetic dipole of a spacecraft is undesired from an attitude control point-of-view. Spacecraft designers make every effort to minimize these undesired magnetic dipoles. This torque only happens near planets with large magnetic fields such as the Earth or Jupiter. Many planets do not have magnetic fields. Some spacecraft take advantage of the magnetic field for control. They use rods made of magnetic steel that are wound with coils for control. These rods and coils form simple solenoids. An air coil torquer, which is a flat large area coil of wire, is another way of producing a control dipole.

When they are energized, that is current is passed through the coil, they produce a torque. However, due to hysteresis, even when off the magnetic core retains some magnetic dipole. Despite this, such magnetic torquers are used on geosynchronous satellites for control and for momentum unloading on other types of spacecraft.

Paluszek in U.S. Pat. No. 5,047,945 discloses a method for reducing attitude perturbations attributable to the interaction of magnetic fields of a heavenly body with those of a spacecraft which orbits thereabout that includes the steps of measuring the spacecraft momentum over a portion of an orbit of the spacecraft about the heavenly body, and measuring the body rate over the same portion of the orbit. Information is accessed which relates to the historic magnitude of the magnetic field of the heavenly body in the portion of the orbit, or the magnetic fields may be directly sensed. The magnitude and direction of the magnetic dipole of the spacecraft are estimated from at least the momentum, the body rate and the accessed or sensed information, to form an estimate of the magnetic dipole. This may be a direct estimate or inferred from the attitude motion of the spacecraft Current is passed through coils associated with the spacecraft in response to the estimate for tending to cancel the perturbations. This system is designed to cancel the residual dipole to reduce the disturbance torque. It has no provision for not perturbing the residual dipole and will not work if the residual dipole is not to be cancelled.

SUMMARY

A dipole cancellation system may include a plurality of magnetometers for measuring a device magnetic field associated with a plurality of device coils carrying a primary current running in a second direction that generates the device magnetic field having a primary magnetic dipole moment, and a main compensating coil carrying a compensating current running a first direction that generates a compensating magnetic field having a compensating magnetic dipole moment. The main compensating coil may be positioned such that the primary magnetic dipole moment and the compensating magnetic dipole moment are parallel to each other and such that the compensating magnetic field does not interact with the primary magnetic field. The first current may be selected so that the compensating magnetic dipole moment completely cancels the primary magnetic dipole moment.

The system may also include a star camera that transmits an attitude measurement, an inertial measurement unit transmits a rate measurement, a sun sensor that transmits an angle measurement, and an estimator that calculates an estimated torque based on the attitude measurement, the rate measurement and the angle measurement. The first current may be, for example, selected based on the estimated torque, the device magnetic field, and an external magnetic field. The estimator may use an unscented Kalman filter to determine the estimated torque.

The system may be part of a spacecraft and the plurality of device magnetic coils may be components of a nuclear fusion rocket engine. The compensating coil, for example, may be comprised of a conductive metal, for example, copper. The compensating coil may be comprised of a superconducting material or a material having a high magnetic permeability. Such a coil may be surrounded by a copper coil. The compensating coil is attached to an extendable structure.

The system may also include one or more trim coils configured to compensate for variations in the device magnetic field over the length of the system. The compensating coil may be mounted on a 2-axis gimbal to compensate for variations in the device magnetic field over the length of the system. The compensating coil may be on a deployable arm.

A method of stabilizing a spacecraft includes, for example, receiving an estimated torque of the spacecraft from a torque estimator, which receives data from a star camera, an inertial measurement unit and a star sensor. The method may also include receiving a value for an external magnetic field associated with a planetary body, such as the Earth which may be determined by an Earth field model with input from a navigation system. The method may also include receiving a value for a device magnetic field associated with a plurality of device coils of a device component of the spacecraft and carrying a primary current running in a second direction that generates the device magnetic field having a primary magnetic dipole moment. A compensating dipole model may be used to calculate a level of compensating current to be applied to a compensating coil sufficient to generate a compensating magnetic field having a compensating magnetic dipole moment that cancels out the primary magnetic dipole moment. The compensating current may be then applied to the compensating coil to cancel the primary magnetic dipole moment, wherein the spacecraft is stabilized.

DETAILED DESCRIPTION

This disclosure describes a magnetic dipole cancellation device for use in space. Certain space devices such as fusion reactors, scientific instruments and radio-frequency thrusters, require large magnetic fields. The interaction of these fields with the Earth's or planet's magnetic field or any other external magnetic field, creates a dipole that produces a torque on the device that must be cancelled. Otherwise the spacecraft will rotate. If the dipole is very large it may be impractical to compensate with thrusters due to the large fuel consumption required. The subject cancellation device uses a current carrying coil to cancel the dipole of the primary device. The compensating coil must be located so as not to perturb the primary dipole. This invention is specifically for systems where the dipole of the primary device must not be perturbed by the compensating system.

Take, for example, a single nuclear fusion rocket engine (such as, for example, that described in U.S. Pat. No. 9,822,769, the entire contents of which are incorporated herein by reference) with, for example, 2.5 mega amps (MA) in each of 8 coils of 0.5-meter (m) radius. The dipole moment for a coil is equal to the product of the current and the enclosed area multiplied by the number of coils. Therefore, the dipole moment of this example engine would be about 16 MA/m$^2$.

The torque on a body with a dipole moment M in an external magnetic field B is the cross product of these quantities, T=M×B. The magnetic field of the Earth in low Earth orbit is about 2×10$^{-5}$ T, therefore operating the above described example engine in orbit produces a torque on the order of 300 N·m.

A single compensating coil having a 2 m radius would need a current of 1.25 MA to cancel the torque described above. A compensating coil of 5 m radius would need a current of 0.2 MA to cancel the torque described in paragraph 0023. The coil dipole may be parallel to and in the opposite direction to the primary dipole for complete cancellation of the torque. The current runs in the opposite direction of the primary coils. For example, if the primary dipole is aligned along the x-axis the compensating dipole must be in the x-direction though the coil can have y and z position offsets. The compensating coil is placed sufficiently far from the primary dipole so that it does not significantly affect the primary dipole. The location may be located along the primary dipole or along any parallel line. The magnetic field of a loop drops as the cube of the distance from the center of the loop. The location may be constrained by the physical dimensions of the vehicle containing the dipole. It could be placed on an extendable arm to achieve sufficient separation.

The separation between the compensating coil and the engine is important to avoid any disruption of the magnetic field, and by extension the plasma, within the plasma chamber in the case of plasma devices.

The system is needed in the presence of an external magnetic field and may be turned off when no external field is present. The compensating coils may be far enough away from the engine so that its fields do not interfere with the fields of the engine.

Figure 1:
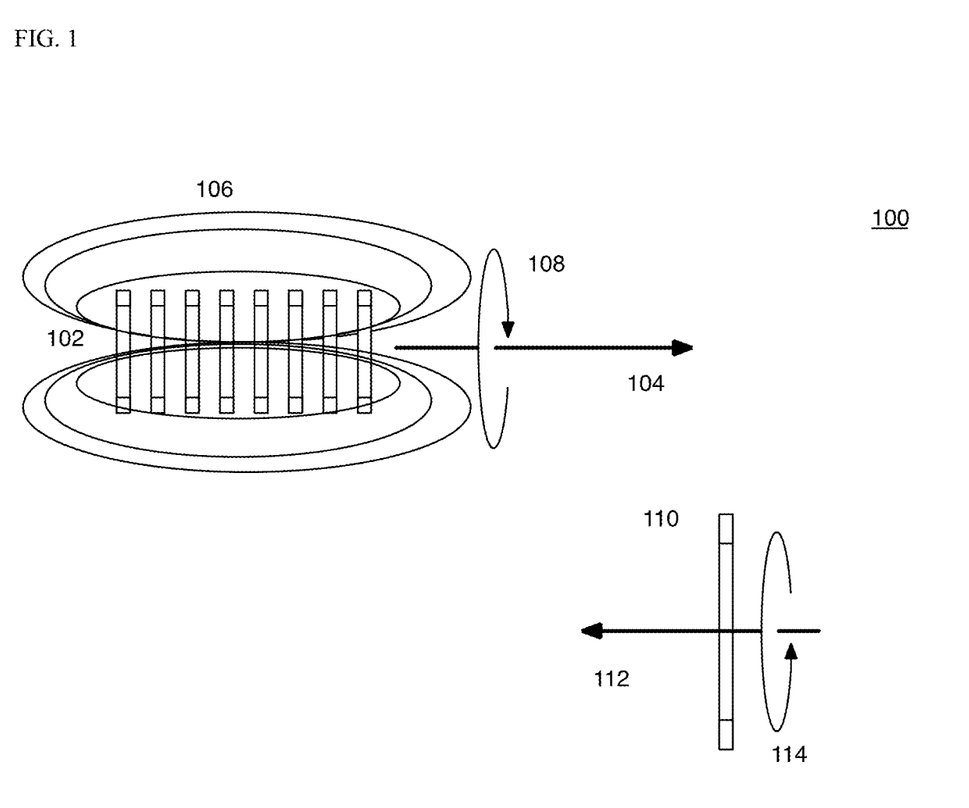
FIG. 1 is a diagram of a solenoid that generates a desired dipole and a compensating coil.

Referring to FIG. 1, the primary coils (102) produce the magnetic dipole moment (104) and the magnetic field lines (106). It is important for the proper functioning of the device with the dipole that the dipole magnetic fields not be perturbed.

In example (100), the current direction (108) is shown. The compensating coil (110) has a compensating dipole moment (112) parallel to (104) and of opposite sign. This is done by running the current in the opposite direction (114).

The compensating coil and the dipole would be connected by a rigid structure. The parallel axis theorem says that the compensating coil may be anywhere if its dipole axis is parallel to the primary dipole axis. In practice, the compensating coil may be made of an ordinary conductor such as copper or aluminum with an air core. In an example, the coil is wrapped around empty space.

In the case of an air core the compensating dipole is $$M = IAN \qquad \text{(Equation 2)}$$

I is the current, A is the area of the air coil and N is the number of turns. The larger the area the higher the dipole.

It can also be made of ordinary conductors wrapped around another material exhibiting a high magnetic permeability such as an iron-cobalt-vanadium soft magnetic alloy (e.g., Hiperco-50), which may be surrounded by a copper coil. The dipole moment M is $$\rho = \frac{l}{r} \qquad \text{(Equation 3)}$$

$$M = \frac{NI\pi rr^2}{\frac{1}{\mu_r} + n_d} \qquad \text{(Equation 4)}$$

$$q = \log(\rho) \qquad \text{(Equation 5)}$$

$$n_d = 4\frac{q-1}{\rho^2 - 4q} \quad \text{(Equation 6)}$$

For this application coil charging time is not a problem since the primary magnetic dipole field is constant. Superconducting material has several advantages. They may have lower mass than similarly sized copper or aluminum coils. They must be cooled to superconducting temperatures prior to charging. Alternatively, it can be made of a superconducting material. In addition, once the superconducting coil is charged, it does not consume power since it has zero resistance.

Figure 2:
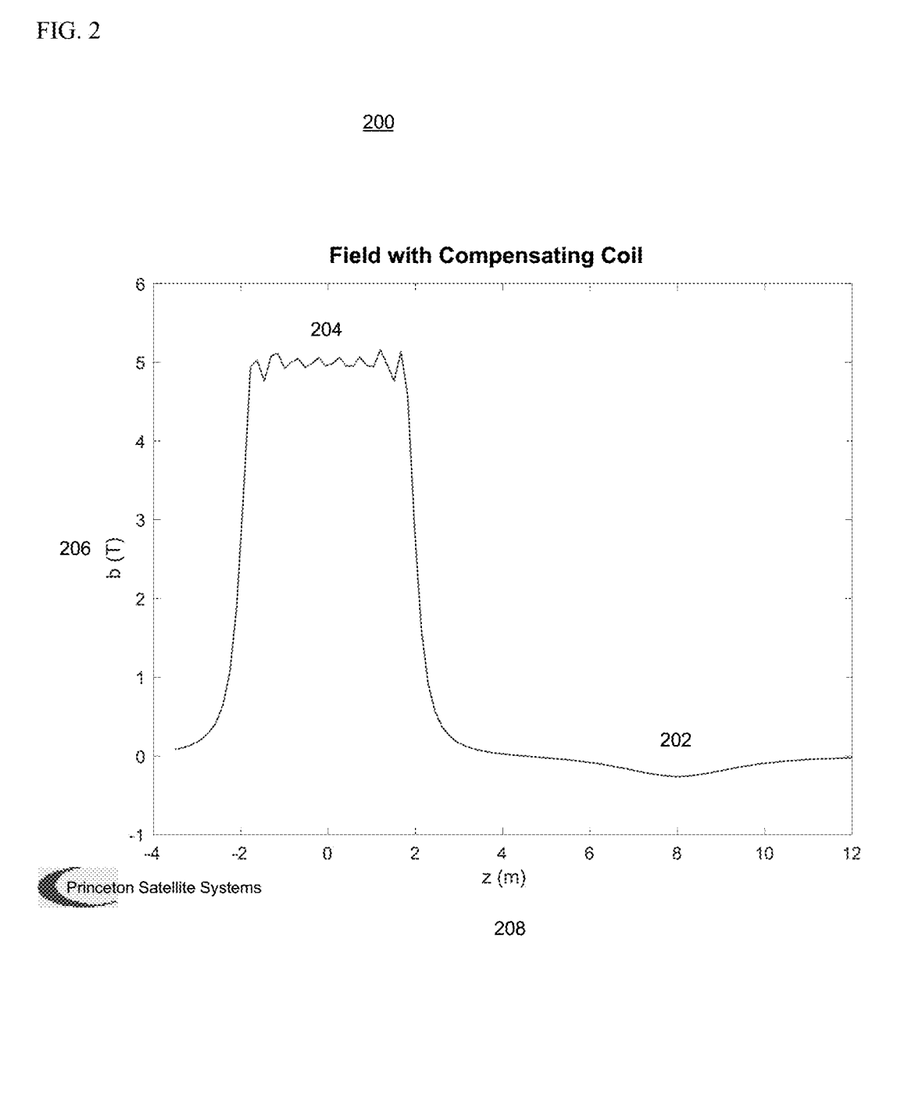
FIG. 2 is a graph of a magnetic field of a dipole and a compensating coil.

Referring to FIG. 2, the compensating dipole moment is seen (202). Its field (206) is much smaller than the device field (204) that is to be cancelled. In this example (200) the cancellation coil is 8 meters (208) from the center of the primary magnetic dipole to be cancelled.

Figure 3:
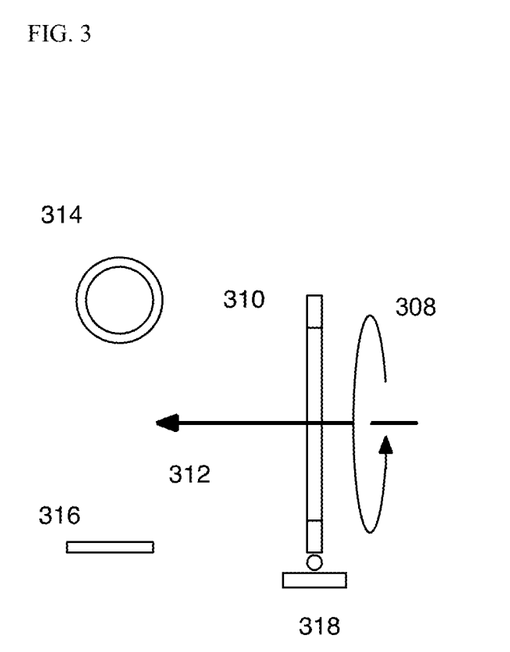
FIG. 3 is a diagram of trim coils and a tilt mechanism on a main coil.

Referring to FIG. 3, a main coil (310) having current (308) produces a compensating magnetic dipole moment (312). Small variations in the magnetic field may cause small torques. These can be corrected using orthogonal trim coils, (314) and (316) or by tilting the main coil (310) using a 2-axis gimbal (318). Tilting the compensating dipole moment (312) allows it to be aligned with the device dipole moment, for example, dipole moment (104) of FIG. 1, to completely cancel the torque.

The compensating coils (310), (314), (316) can be superconducting or can be conventional conductors. Conventional conductors can be more responsive that superconductors because they can change their current faster.

Figure 4:
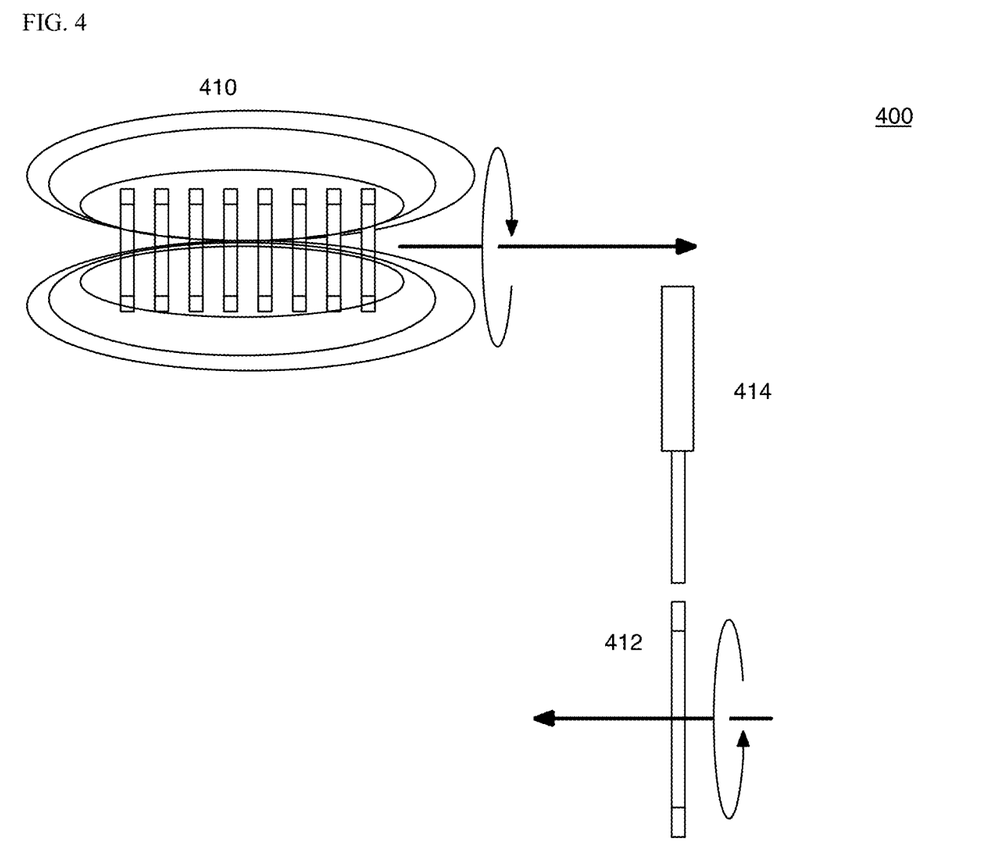
FIG. 4 is a diagram of a compensating coil with an extensible arm.

Referring to FIG. 4, in this example (400) the compensating coil (412) can be on an extensible boom or arm (414). This allows the effect on the main system (410) to be reduced.

Figure 5:
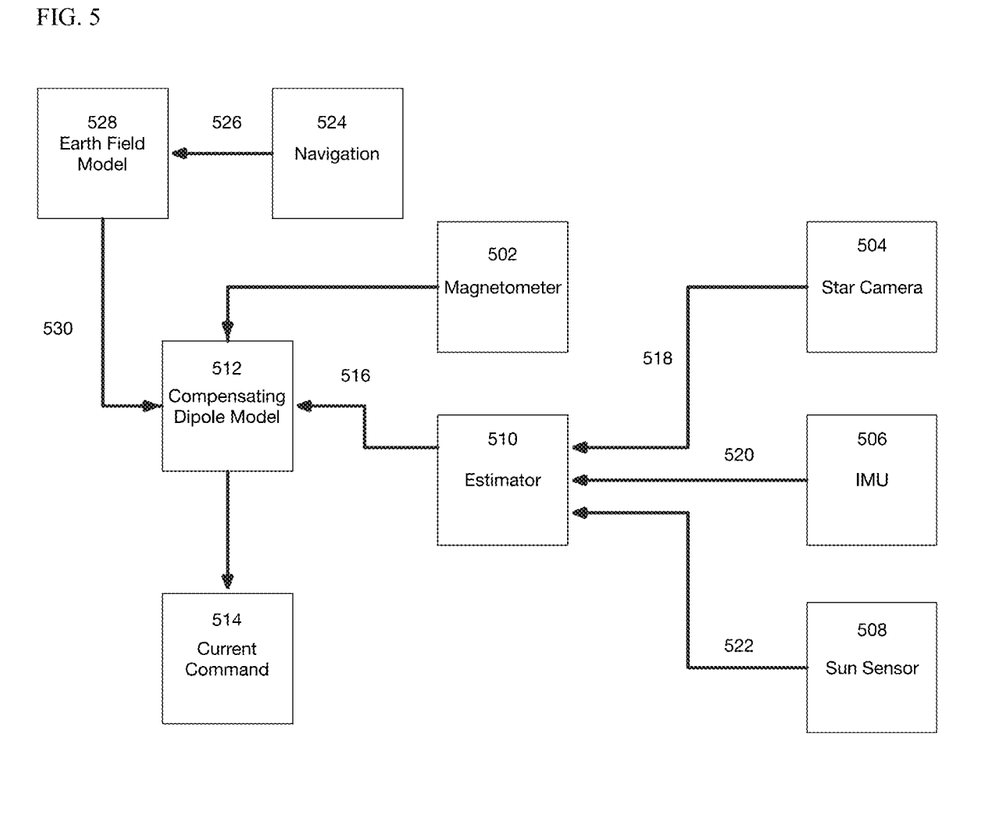
FIG. 5 is a diagram for a disturbance dipole estimator system.

An estimator (510) is used in parallel with the magnetometer to compute the required compensating dipole. FIG. 5 shows the estimation system. The compensating currents are found by measuring the magnetic field with a magnetometer (502) and computing the appropriate currents. The estimator gets attitude measurements (518) from the star sensor (504), angle measurements (522) from the sun sensor (508) and rate measurements (520) from the IMU (506) and calculates an estimated torque (516).

The estimated torque (516) is fed to the compensating coil model (512) using Equation 2 above. The Earth's or planet's magnetic field is computed in a field model (528) that gets the spacecraft position (526) from navigation (524). The position is entered into a spherical harmonic magnetic field model (530). A spherical harmonic magnetic field expands the magnetic field as a series of harmonics of latitude and longitude. Any number of harmonics may be used in the model. The compensating coil model generates current command (514).

Figure 6:
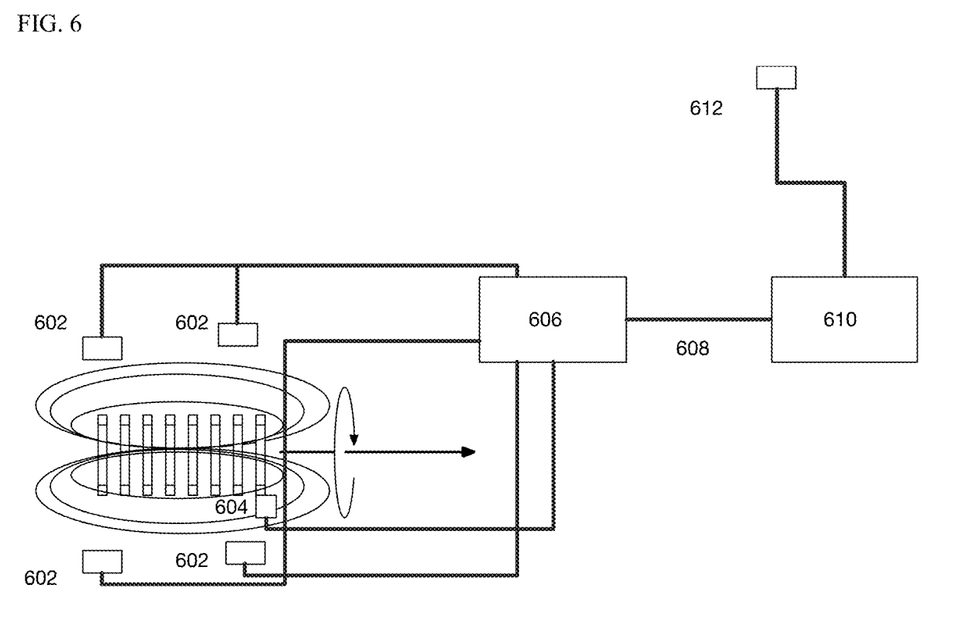
FIG. 6 is a diagram of a data acquisition system.

The data acquisition system in shown in FIG. 6. A plurality of magnetometers (602) measure the magnetic field of the dipole. Each coil has a Hall current sensor (604) (shown in FIG. 6 on only one coil for simplicity of presentation). These measurements are combined by the data acquisition system (606) and transmitted (608) to the estimator (610). A remote magnetometer on a boom (612) measures the Earth's or planet's magnetic field for use in the estimator (610). The magnetometer returns and x, y and z values for the magnetic field. It is digitized in the magnetometer and transmitted on a serial data bus to the computer.

The measured magnetic field is used to estimate the torque on the spacecraft from the relationship T=M×B where B is the measured magnetic field.

The estimator may be of any type. The estimator may be formulated as a state estimator where the desired parameter is a state of the system or as a parameter estimator where the desired parameters are estimated.

A state estimator is a Proportional Integral Derivative controller. This controller is of the form:

$$T = K\left(\theta + \tau_d \dot{\theta} + \frac{1}{\tau}\int \theta\right) \quad \text{(Equation 7)}$$

The resulting torque will have a steady component that is the value of the disturbing torque due to the primary solenoid. This provides a dipole estimate. More complex estimators can also be used without changing the invention.

An example of a more sophisticated estimator is a Kalman filter (UKF). There are four types: Conventional (CKF), Extended (EKF), Unscented (UKF) and Particle. The UKF and EKF are used when the dynamics and measurements are nonlinear, as is the case here. The UKF can achieve greater estimation performance than the Extended Kalman Filter (EKF), which is also suitable for nonlinear systems, by use of the Unscented Transformation (UT). The UT allows the UKF to capture first and second order terms of the nonlinear system. It may be formulated as a state estimator, a parameter estimator or a dual estimator that estimates parameters and states simultaneously. The UKF does not require any derivatives or Jacobians (a matrix of derivatives) of either the state equations or measurement equations. For a state estimator, instead of just propagating the state, the filter propagates the state and additional sigma points which are the states plus the square roots of rows or columns of the covariance matrix. Thus, the state and the state plus a standard deviation of the state are propagated. This captures the uncertainty in the state. It is not necessary to numerically integrate the covariance matrix.

Sigma points are found from the Cholesky decomposition of the covariance matrix σ=c×chol(p) where c is a weighting vector and p is the covariance matrix. The covariance matrix gives the current value of the uncertainty of the states and parameters and their cross-correlations. There is on sigma point vector for every element of the diagonal of p.

Figure 7:
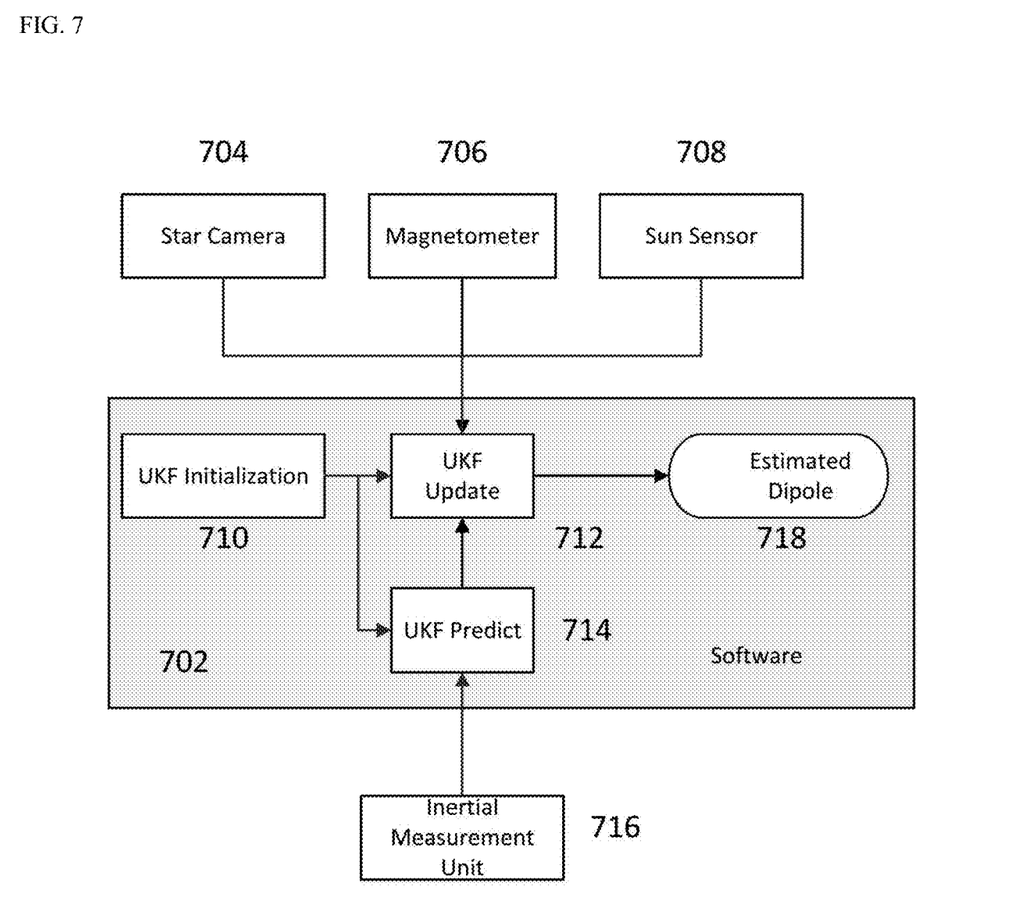
FIG. 7 is a diagram of the Unscented Kalman filter used as an estimator.

FIG. 7 shows the operation of the UKF estimator (702). It is necessary to estimate the attitude of the spacecraft to determine the torque on the spacecraft and therefore the dipole. The star camera (704), magnetometer (706) and sun sensor (708) feed into the UKF estimator update step (712). Prior to operation of the estimator the weighing matrices are computed (710). The estimator computes estimated measurements and finds the residual between those measurements and the measurement sigma points. This produces the measurement update of the parameter or state vector.

The predict step (714) propagates dynamical states, if there are any. The state sigma points are all propagated and the mean of the propagated states are the new estimate. Parameters generally are fixed. If they drift with time a Markov model is usually employed.

$$w = -\delta w + n \quad \text{(Equation 8)}$$

where w is the parameter vector and δ the inversed time constant. n is Gaussian white noise.

The estimated dipole (718) is produced at the update step. An inertial measurement unit (IMU) (716) is the attitude dynamics base. This means that the dynamical model is that of the IMU not the spacecraft itself.

Although the scenarios herein have been described regarding embodiments, it is to be understood that these embodiments are merely illustrative of the principles and applications of the disclosed scenarios. It is therefore to be understood that numerous modifications may be made to the illustrative embodiments and that other arrangements may be devised without departing from the spirit and scope of the disclosed scenarios as defined by the appended claims.

The invention claimed is:

1. A dipole cancellation system for use in a spacecraft comprising:
   a plurality of magnetometers configured to measure a device magnetic field associated with a plurality of device coils of a device component of the spacecraft carrying a primary current running in a second direction that generates the device magnetic field having a primary magnetic dipole moment; and
   a main compensating coil configured to carry a compensating current running a first direction that generates a compensating magnetic field having a compensating magnetic dipole moment;
   wherein the main compensating coil is positioned such that the primary magnetic dipole moment and the compensating magnetic dipole moment are parallel to each other and such that the compensating magnetic field does not interact with the primary magnetic field; and
   wherein the first current is selected so that the compensating magnetic dipole moment completely cancels the primary magnetic dipole moment.

2. The system of claim 1, further comprising:
   a star camera that transmits an attitude measurement;
   an inertial measurement unit transmits a rate measurement;
   a sun sensor that transmits an angle measurement; and
   an estimator that calculates an estimated torque based on the attitude measurement, the rate measurement and the angle measurement.

3. The system of claim 2, wherein the first current is selected based on the estimated torque, the device magnetic field, and an external magnetic field.

4. The system of claim 2, wherein the estimator uses an unscented Kalman filter to determine the estimated torque.

5. The system of claim 1, wherein the plurality of device magnetic coils are components of a nuclear fusion rocket engine.

6. The system of claim 1 in which the compensating coil is comprised of a conductive metal.

7. The system of claim 6, wherein the metal is copper.

8. The system of claim 1, wherein the compensating coil is comprised of a superconducting material.

9. The system of claim 1, wherein the compensating coil is comprised of a material having a high magnetic permeability surrounded by a copper coil.

10. The system of claim 1, wherein the compensating coil is attached to an extendable structure.

11. The system of claim 1 further comprising one or more trim coils configured to compensate for variations in the device magnetic field over a length of the system.

12. The system of claim 1, wherein the compensating coil is mounted on a multi-axis gimbal to compensate for variations in the device magnetic field over a length of the system.

13. The system of claim 1, wherein the compensating coil is on a deployable arm.

14. A method of stabilizing a spacecraft, the method comprising:
   receiving an estimated torque of the spacecraft;
   receiving a value for an external magnetic field associated with a planetary body;
   receiving a value for a device magnetic field associated with a plurality of device coils of a device component of the spacecraft and carrying a primary current running in a second direction that generates the device magnetic field having a primary magnetic dipole moment;
   calculating a level of compensating current to be applied to a compensating coil sufficient to generate a compensating magnetic field having a compensating magnetic dipole moment that cancels out the primary magnetic dipole moment;
   applying the compensating current to the compensating coil to cancel the primary magnetic dipole moment, wherein the spacecraft is stabilized.

* * * * *